Jan. 12, 1960 WOO FOUNG CHOW 2,921,196
TRANSISTOR REGENERATIVE DETECTOR CIRCUIT
Filed Feb. 14, 1955
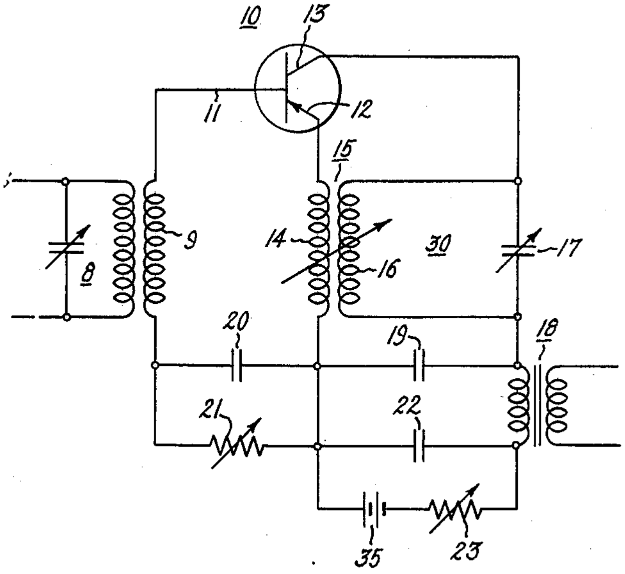
INVENTOR:
WOO F. CHOW,
BY George V. Eltgroth
HIS ATTORNEY.

2,921,196

TRANSISTOR REGENERATIVE DETECTOR CIRCUIT

Woo Foung Chow, Syracuse, N.Y., assignor to General Electric Company, a corporation of New York Application February 14, 1955, Serial No. 488,060

7 Claims. (Cl. 250—31)

This invention relates to regenerative detector circuits and more particularly to circuits of this character utilizing transistor devices.

In commercially known transistor devices, the power gain of a given transistor decreases rapidly with the increase of signal frequency. Due to this operating characteristic, many R.F. and I.F. amplifier stages may be required in order to obtain a high signal level. The use of a large number of radio frequency and intermediate frequency stages may prove advantageous in providing an excellent signal to noise ratio and in providing good fidelity of the audio output signal. However, for application in small, portable communication equipment, simplicity of circuitry and construction are paramount considerations. For portable receiver design, the required sensitivity must be obtained using a minimum number of amplifier stages.

It is an object of the present invention to provide a new and improved regenerative detector circuit utilizing transistor devices.

It is a further object of the present invention to provide a detector circuit which has a minimum number of amplifier stages yet provides excellent sensitivity.

Still another object of the present invention is to provide a new and improved regenerative detector circuit which is simple in construction and efficient in operation.

These and other advantages of this invention will be more clearly understood from the following description taken in connection with the accompanying drawing, and the new and novel features that are considered characteristic of this invention will be set forth with particularity in the appended claims.

In the drawing, the circuit shown is a diagrammatic illustration of the invention.

The embodiment of the invention illustrated in the drawing uses a PNP junction-type transistor 10. An input signal selected by resonant circuit 8 may be fed by inductive coupling to an inductance 9 which is connected to the base electrode 11 of transistor 10. Collector electrode 13 of transistor 10 is connected to a resonant circuit 30 which includes an inductance 16 and a variable capacitance 17. Resonant circuit 30 is regeneratively coupled to the emitter electrode 12 of transistor 10 by an inductance 14. The windings of inductances 14 and 16 form a transformer 15 which has variable coupling. An output transformer 18 is connected to the resonant circuit 30. The positive terminal of a source of potential 35 is connected to the base electrode 11 of transistor 10 through a variable resistance 21 and inductance 9. Variable resistance 21 is shunted by a radio frequency by-pass capacitance 20. The negative terminal of source of potential 35 is connected through a variable resistance 23 to output transformer 18. The source of potential 35 and variable resistance 23 are shunted by an audio frequency by-pass capacitor 22. A radio frequency by-pass capacitor 19 is connected between resonant circuit 30 and inductance 14. Variable resistances 21 and 23 are used to supply the proper bias for PNP junction-type transistor 10. When the proper biasing values are determined, these variable resistances may be replaced by resistances with fixed values.

In operation, the disclosed circuit makes use of the fact that there are amplified signal currents along with rectified signal currents in the output circuit of transistor 10. By regeneratively coupling the output circuit to the input circuit of transistor 10, the R.F. voltage applied to the detector increases which correspondingly increases the rectified output signal, thus giving greater sensitivity.

The present commercially known junction and point contact transistors have small power gain at high frequencies. However, junction-type transistors have very good gain at audio frequencies. The present invention utilizes this property profitably by detecting R.F. signals at a low level, and then amplifying the audio signals. This is accomplished by regeneration.

It has been found that the minimum R.F. signal required for a transistor detector is on the order of 5 to 10 millivolts. An input signal inductively coupled from resonant circuit 8 by inductance 9 is applied to base electrode 11 of transistor 10. This R.F. signal is comparatively small. It appears amplified at collector electrode 13 by transistor action, and appears across resonance circuit 30. A portion of this signal is fed back to emitter electrode 12 of transistor 10 by transformer 15. Due to the positive feedback from resonant circuit 30 to emitter electrode 12, the signal is again amplified. The R.F. signal is amplified in this manner until it rises to a level of about 10 millivolts, then the emitter-base junction of transistor 10 begins detecting the R.F. signal. At this time, changes in emitter current appear as changes in collector current, and these changes approximate the envelope of the incoming signal. Thus, the signal strength of an incoming R.F. signal is built up to a value to allow transistor detection and amplification of the detected signal. Since detection of the R.F. signal produces a current which varies at an audio frequency rate, and since the transistor provides excellent gain in the audio frequency range, the resulting sensitivity is greatly enhanced by utilizing transistor 10 in the detector circuit. The detection operation is aided by biasing the emitter electrode 12 of transistor 10 at a low level.

Another feature is the extended range of linear detection exhibited by this network. It is believed that this may be explained by the fact that detection can occur by reason of the non-linearity of the emitter current collector current characteristic, and also by reason of rectification effects at the base-emitter junction giving rise to a voltage corresponding to the modulation envelope across capacitor 20 and resistor 21. These two effects tend to oppose each other in their influence of detected output current. However, the lower alpha of the transistor at radio frequencies diminishes the collector curvature effect relative to the junction rectifying effect which latter effect operates to impress on the base electrode a modulation frequency voltage amplified by the higher alpha existing in the transistor at modulation frequencies. As noted, by assisting in the predominance of the signals produced through rectification at the base-emitter junction, the frequency dependence of the transistor amplification factor is turned to advantage for the extension of the linear detection range.

The amount of regeneration in the described circuit may be controlled by varying the coupling between the windings of transformer 15. When regeneration is carried as far as possible without producing oscillations, the resulting increase in amplitude is great for extremely weak signals. The amount of regeneration should be controlled to insure that the circuit will not start oscillating, otherwise, the resulting output signal may be extremely distorted or inaudible.

By way of example only, experimental results have shown a junction transistor which has about 10 db power gain at a frequency of approximately 1 megacycle can function very well as a regenerative detector using the described circuit. For a 1 megacycle R.F. signal of 100 microvolts with 80% modulation by a 400 cycle signal, an audio frequency output of 3 millivolts was obtained. It will be appreciated that other transistor devices and various signal frequencies suited for a particular application may be used. The cited example is used merely to illustrate an application of principles embodied in this invention.

It should be noted that a resonant circuit may be utilized to apply an incoming radio frequency signal to the base electrode 11 of transistor 10. This would provide better receiver selectivity. Also, output transformer 18 may be replaced with a set of headphones (not shown), or a resistance in combination with a coupling capacitor (not shown). It will also appear obvious to those skilled in the art, that an NPN junction-type transistor may be used with the described circuit by changing the polarities of source of potential 35.

Since other modifications and changes varied to fit particular operating requirements and environments will be apparent to those skilled in the art, the invention is not considered limited to the examples chosen for purposes of disclosure and covers all modifications which do not constitute departures from the true spirit and scope of this invention.

What I claim as new and desire to secure by Letters Patent of the United States is:

1. A circuit for detecting amplitude modulated signals comprising a transistor having base, emitter and collector electrodes, means including a first inductance for applying said signals to said base electrode, a second inductance, means connecting said second inductancve to said emitter electrode, a resistance capacitance network, means connecting said resistance capacitance network between said first and second inductances, a tuned circuit inductively coupled to said second inductance, means connecting said tuned circuit to said collector electrode, utilization means connected to said tuned circuit, a source of potential, and means connecting said source of potential between said resistance and said utilization means.

2. A regenerative detector comprising a junction type transistor having base, emitter and collector electrodes, a resistance capacitance network, means including an inductance connected between said base electrode and said resistance capacitance network for applying a signal to said base electrode, a source of potential having two terminals, means connecting said resistance capacitance network to one terminal of said source of potential, a second inductance, means connecting said second inductance between said emitter electrode and said one terminal of said source of potential, a tuned circuit, said tuned circuit being regeneratively coupled to said second inductance, output means, means connecting said tuned circuit to said collector electrode and to said output means, a second resistance, and means connecting said second resistance betwen the other terminal of said source of potential and said output means.

3. The detector defined in claim 2 including means for varying the coupling between said tuned circuit and said second inductance.

4. A regenerative detector comprising a junction transistor having base, emitter, and collector electrodes, an impedance having one terminal coupled to said emitter, a radio frequency signal input circuit for applying modulated radio frequency signals to said transistor coupled between the base electrode of said transistor and the other terminal of said impedance, including a resistance-capacitance network of low radio frequency impedance, whereby amplified radio frequency signals appear at said collector electrode, means providing a regenerative radio frequency coupling from said collector electrode to said emitter electrode, thus coupling amplified radio frequency signals to said emitter amplified for facilitating detection thereof by action of said base and emitter electrodes, and utilization means coupled to said collector electrode for deriving therefrom an amplified version of the detected radio frequency signal.

5. The combination set forth in claim 4 wherein one end terminal of said resistance-capacitance network is coupled to said other terminal of said impedance.

6. In the combination set forth in claim 4, biasing means coupled to the electrodes of said transistor adjusted to operate the same at a low level to facilitate detection of low amplitude radio frequency signals.

7. A regenerative detector comprising a junction transistor having base, emitter, and collector electrodes, an impedance having one terminal coupled to said emitter, a radio frequency signal input circuit for applying modulated radio frequency signals to said transistor coupled between the base electrode of said transistor and the other terminal of said impedance, external biasing means coupled to said electrodes of said transistor adjusted to permit amplification of low amplitude radio frequency signals, said amplified radio frequency signals appearing at said collector electrode, a resistance-capacitance network coupled in circuit with said base and emitter electrode for facilitating detection, means providing a regenerative radio frequency coupling from said collector electrode to said emitter electrode, thus coupling amplified radio frequency signals to said emitter of sufficient amplitude to permit detection thereof by action of said base and emitter electrodes, and utilization means coupled to said collector electrode for deriving therefrom an amplified version of the detected radio frequency signal.

References Cited in the file of this patent

UNITED STATES PATENTS

| | | |
|---|---|---|
| 1,113,149 | Armstrong | Oct. 6, 1914 |
| 2,809,239 | Nielson | Oct. 8, 1957 |

FOREIGN PATENTS

| | | |
|---|---|---|
| 144,789 | Australia | Jan. 17, 1952 |
| 683,565 | Great Britain | Dec. 3, 1952 |

OTHER REFERENCES

Bohr: "Transistor Regenerative Receiver," Radio Electronics, April 1954; pp 71 to 76; vol. XXV, N. 4.